United States Patent
Li

(10) Patent No.: US 9,014,552 B2
(45) Date of Patent: Apr. 21, 2015

(54) METHOD AND SYSTEM FOR TESTING JITTER COMPATIBILITY

(75) Inventor: Meng Li, Shenzhen (CN)

(73) Assignee: ZTE Corporation, Shenzhen, Guangdong Province (CN)

( * ) Notice: Subject to any disclaimer, the term of this patent is extended or adjusted under 35 U.S.C. 154(b) by 106 days.

(21) Appl. No.: 13/810,226

(22) PCT Filed: Dec. 28, 2010

(86) PCT No.: PCT/CN2010/080390
§ 371 (c)(1),
(2), (4) Date: Jan. 15, 2013

(87) PCT Pub. No.: WO2012/006858
PCT Pub. Date: Jan. 19, 2012

(65) Prior Publication Data
US 2013/0114955 A1    May 9, 2013

(30) Foreign Application Priority Data

Jul. 15, 2010 (CN) .......................... 2010 1 0230931

(51) Int. Cl.
*H04B 10/079* (2013.01)
*H04B 10/07* (2013.01)
(Continued)

(52) U.S. Cl.
CPC ............ *H04B 10/0775* (2013.01); *H04B 3/462* (2013.01); *G01R 31/31709* (2013.01); *H04B 10/0795* (2013.01); *H04B 10/07* (2013.01)

(58) Field of Classification Search
CPC ... H04B 3/462; H04B 10/07; G01R 31/31709
USPC ....................................... 398/9, 25
See application file for complete search history.

(56) References Cited

U.S. PATENT DOCUMENTS 7,203,460 B2 *    4/2007    Boose et al. ............... 455/67.11
2003/0081278 A1 *    5/2003    Chujo et al. .................. 359/110
(Continued)

FOREIGN PATENT DOCUMENTS

CN    1595485 A    3/2005
CN    1741427 A    3/2006
(Continued)

OTHER PUBLICATIONS

"Jitter and wander measuring equipment for digital systems which are based on the synchronous digital hierarchy (SDH)"; ITU-T, O.172 (Apr. 2005); Specifications of Measuring Equipment, Equipment for the measurement of digital and analogue/digital parameters; XP17464618A; See the whole document.
(Continued)

*Primary Examiner* — Nathan Curs
(74) *Attorney, Agent, or Firm* — Ling Wu; Stephen Yang; Ling and Yang Intellectual Property

(57) ABSTRACT

A method and system for testing jitter compatibility are disclosed in the present invention, which includes: an interconnection testing board configured with a non-NRZ optical transponder needing to satisfy the board jitter performance specification, and according to the specification, testing the jitter performance of the interconnection testing board to indirectly judge whether the jitter compatibility of non-NRZ optical transponder at a line side of the interconnection testing board is qualified, wherein: at the line side and a client side of the interconnection testing board, a non-NRZ optical transponder to be tested and an NRZ optical transponder with qualified jitter performance are configured respectively, and the jitter performance of interconnection testing board is tested; if the qualified jitter performance of interconnection testing board is obtained through testing, believing that the jitter compatibility of non-NRZ optical transponder to be tested is qualified.

9 Claims, 2 Drawing Sheets

(51) Int. Cl.
*G01R 31/317* (2006.01)
*H04B 10/077* (2013.01)

(56) References Cited

U.S. PATENT DOCUMENTS

2006/0251200 A1\* 11/2006 Miller ........................ 375/371
2009/0274455 A1 11/2009 Dvir et al.

FOREIGN PATENT DOCUMENTS

JP 2009175057 A 8/2009
WO 2006091810 A2 8/2006

OTHER PUBLICATIONS

International Search Report for PCT/CN2010/080390 dated Apr. 14, 2011.

\* cited by examiner

METHOD AND SYSTEM FOR TESTING JITTER COMPATIBILITY

TECHNICAL FIELD

The present invention relates to a Dense Wavelength Division Multiplexing (DWDM) system in an optical network, and particularly, to a method and system for testing jitter compatibility.

BACKGROUND OF THE RELATED ART

With the development of technology and the increase of demand, people have increasingly stronger demands for an optical network with higher speed and larger bandwidth. However, in the circumstance of small channel spacing with high rate, since an optical pulse modulation technology based on the No Return Zero (NRZ) modulation format widely used at present has adverse factors such as comparatively serious nonlinear effect and crosstalk and so on, operational requirements can not be satisfied yet. Therefore, a non-NRZ optical pulse modulation technology has become a research hotspot of optical transmission technology in recent years.

Compared with a traditional NRZ modulation technology, the non-NRZ optical pulse modulation technology has the concentrated optical spectral energy and high spectrum efficiency, which can improve chromatic dispersion tolerance and nonlinearity tolerance in transmission with long distance and large capacity, and enhance the transmission performance of a DWDM system significantly.

In the entire DWDM system, modulation and demodulation of optical carriers are completed by an optical transponder. With regard to a system with a single channel at 40 Gb/s or above, in order to implement long distance transmission, optical transponders all use the non-NRZ optical pulse modulation technology basically, and in the non-NRZ modulation technology, the phase modulation technology obtains the most comprehensive recognition. However, the ultra-high rate raises more severe requirements on signal quality of the optical transponder, besides regular indexes such as bit error ratio and Optical Signal to Noise Ratio (OSNR) and so on, a jitter index is also an system performance index of great importance.

In a digital communication system, jitter describes the short-term relative change of a digital signal deviating from the ideal time and location at an important time point. The jitter has numerous different random sources and nonrandom (determinacy) sources. Thermal noise, craft, crosstalk and Electromagnetic Compatibility (EMI) radiation and so on may all cause the jitter. In the DWDM system, the jitter will influence the synchronization of subsystem, and excessive jitter will directly produce a big bit error, which seriously deteriorates the transmission performance of DWDM system. Therefore, with regard to the optical transponder as a core component of the DWDM system, it is necessary to inspect the jitter index of the optical transponder.

Currently, in a jitter meter, an optical interface in a special modulation code pattern is not considered, thus the jitter performance of an optical module with non-NRZ modulation can not be tested directly.

SUMMARY OF THE INVENTION

The technical problem required to be solved by the present invention is to provide a method and system for testing jitter compatibility, which implements testing on the jitter compatibility of an optical transponder using a non-NRZ modulation format.

In order to solve the above technical problem, the present invention provides a method for testing jitter compatibility, wherein, an interconnection testing board configured with a non-No Return Zero (NRZ) optical transponder needs to satisfy a board jitter performance specification, and according to the board jitter performance specification, a jitter performance of the interconnection testing board is tested to indirectly judge whether the jitter compatibility of the non-NRZ optical transponder at a line side of the interconnection testing board is qualified, the method comprises:

at the line side and a client side of the interconnection testing board, configuring a non-NRZ optical transponder to be tested and a NRZ optical transponder with a qualified jitter performance respectively, and performing testing on the jitter performance of the interconnection testing board;

according to a principle that a non-NRZ optical transponder with a qualified jitter performance should not cause a jitter performance of a board to which the non-NRZ optical transponder with the qualified jitter performance belongs to be unqualified, if the jitter performance of the interconnection testing board obtained through testing is qualified, believing that the jitter compatibility of the non-NRZ optical transponder to be tested is qualified; and the interconnection testing board being a board of which a jitter performance is also qualified when the NRZ optical transponder with the qualified jitter performance is configured at both the client side and the line side.

Before performing testing on the jitter performance of the interconnection testing board, the above method further comprises:

performing self-loopback connection to the non-NRZ optical transponder to be tested, and the non-NRZ optical transponder to be tested and the NRZ optical transponder performing electrical loopback connection through the interconnection testing board;

connecting a jitter testing meter to the NRZ optical transponder, so as to perform testing on the jitter performance of the interconnection testing board at the side of the NRZ optical transponder, thereby judging whether the jitter performance of the interconnection testing board is qualified.

A signal converter is configured in the electrical loopback connection, and the above method further comprises:

when the NRZ optical transponder sends an electrical signal to the non-NRZ optical transponder to be tested through the electrical loopback connection, the signal converter converting a format of the sent electrical signal to a format meeting requirements of the non-NRZ optical transponder to be tested.

The step of configuring a non-NRZ optical transponder to be tested and a NRZ optical transponder respectively at the line side and a client side of the interconnection testing board comprises:

performing testing and obtaining two NRZ optical transponders with the qualified jitter performance, and configuring the two NRZ optical transponders to the line side and the client side of the interconnection testing board respectively;

after configuring the two NRZ optical transponders on the interconnection testing board is completed, performing testing on the jitter performance of the interconnection testing board, if the jitter performance is qualified, removing the NRZ optical transponder at the line side of the interconnection testing board, and configuring the non-NRZ optical transponder to be tested to the line side of the interconnection testing board.

The above method further comprises: after performing testing on the jitter performance of the interconnection testing board, if the jitter performance of the interconnection testing board obtained through testing is unqualified, believing that the jitter compatibility of the non-NRZ optical transponder to be tested is unqualified.

The step of performing testing on the jitter performance of the interconnection testing board comprises:

the jitter testing meter sending a testing optical signal to the NRZ optical transponder;

the NRZ optical transponder performing optical-to-electrical conversion on the testing optical signal, performing format conversion on the obtained electrical signal through the signal converter, and performing an electrical loopback connection on the electrical signal to the non-NRZ optical transponder to be tested;

the non-NRZ optical transponder to be tested performing electrical-to-optical conversion on the electrical signal, looping back the obtained optical signal to a receiving terminal of the non-NRZ optical transponder to be tested, further performing optical-to-electrical conversion, and performing electrical loopback connection on the obtained electrical signal to a transmitting terminal of the NRZ optical transponder; and the NRZ optical transponder performing electrical-to-optical conversion on the received electrical signal, and transmitting the obtained optical signal to an input terminal of the jitter testing meter, thereby obtaining the jitter performance of the interconnection testing board.

The present invention further provides a system for testing jitter compatibility, which comprises: a No Return Zero (NRZ) optical transponder, an interconnection testing board and a jitter testing meter, wherein:

the NRZ optical transponder is configured at a client side of the interconnection testing board, and a jitter performance is qualified;

the interconnection testing board is configured to: provide a testing platform and an interface, and configure a non-NRZ optical transponder to be tested at a line side, wherein the interconnection testing board satisfies a board jitter performance specification, and the jitter performance of the interconnection testing board is tested to indirectly judge whether the jitter compatibility of the non-NRZ optical transponder to be tested is qualified; when the interconnection testing board configures the NRZ optical transponder with the qualified jitter performance at both the client side and the line side, the jitter performance of the interconnection testing board is also qualified; and the jitter testing meter, connected with the NRZ optical transponder, is configured to: performing testing on the jitter performance of the interconnection testing board, according to a principle that the non-NRZ optical transponder with the qualified jitter performance should not cause the jitter performance of a board to which the non-NRZ optical transponder with the qualified jitter performance belongs to be unqualified, if the jitter performance of the interconnection testing board obtained through testing is qualified, believe that the jitter compatibility of the non-NRZ optical transponder to be tested is qualified.

The non-NRZ optical transponder to be tested uses a self-loopback connection, and the non-NRZ optical transponder to be tested and the NRZ optical transponder performs an electrical loopback connection through the interconnection testing board.

A signal converter is configured in the electrical loopback connection;

the signal converter is configured to: when the NRZ optical transponder sends an electrical signal to the non-NRZ optical transponder to be tested through the electrical loopback connection, convert a format of the sent electrical signal to a format meeting requirements of the non-NRZ optical transponder to be tested.

When performing testing on the jitter performance of the interconnection testing board, the jitter testing meter sends a testing optical signal to the NRZ optical transponder;

the NRZ optical transponder performs optical-to-electrical conversion on the testing optical signal, performs format conversion on the obtained electrical signal through the signal converter, and performs the electrical loopback connection on the electrical signal to the non-NRZ optical transponder to be tested;

the non-NRZ optical transponder to be tested performs electrical-to-optical conversion on the electrical signal, loops back the obtained optical signal to a receiving terminal of the non-NRZ optical transponder to be tested, further performs optical-to-electrical conversion, and performs electrical loopback connection on the obtained electrical signal to a transmitting terminal of the NRZ optical transponder; and the NRZ optical transponder performs electrical-to-optical conversion on the received electrical signal, and transmits the obtained optical signal to an input terminal of the jitter testing meter, thus the jitter testing meter obtains the jitter performance of the interconnection testing board.

In conclusion, the present invention introduces a method for indirectly testing jitter compatibility of an optical transponder in a non-NRZ modulation format, and uses the existing devices and testing means to make judgments on the jitter compatibility of the optical transponder in the non-NRZ modulation format, which can reflect the jitter performance of the optical transponder in the non-NRZ modulation format more truly, and provide a basis for inspecting jitter compatibility indexes of such kind of modules. With the present, in the condition that no existing testing meter and standard specification directly support the testing of the jitter compatibility of optical transponder in the non-NRZ modulation format, the testing on the jitter compatibility is implemented, which truly reflects whether the jitter performance of the optical transponder in the non-NRZ modulation format can meet system requirements.

PREFERRED EMBODIMENTS OF THE PRESENT INVENTION

In the method for testing jitter compatibility of an optical transponder using a non-NRZ modulation format according to the embodiment of the present invention, by testing a jitter performance of an interconnection testing board to indirectly judge whether the jitter compatibility of a non-NRZ optical transponder at a line side of the interconnection testing board is qualified, if the jitter performance of the interconnection testing board obtained through testing is qualified, it is believed that the jitter compatibility of a non-NRZ optical transponder to be tested is qualified.

The embodiments of the present invention will be described in detail in combination with the accompanying drawings below.

Figure 1:
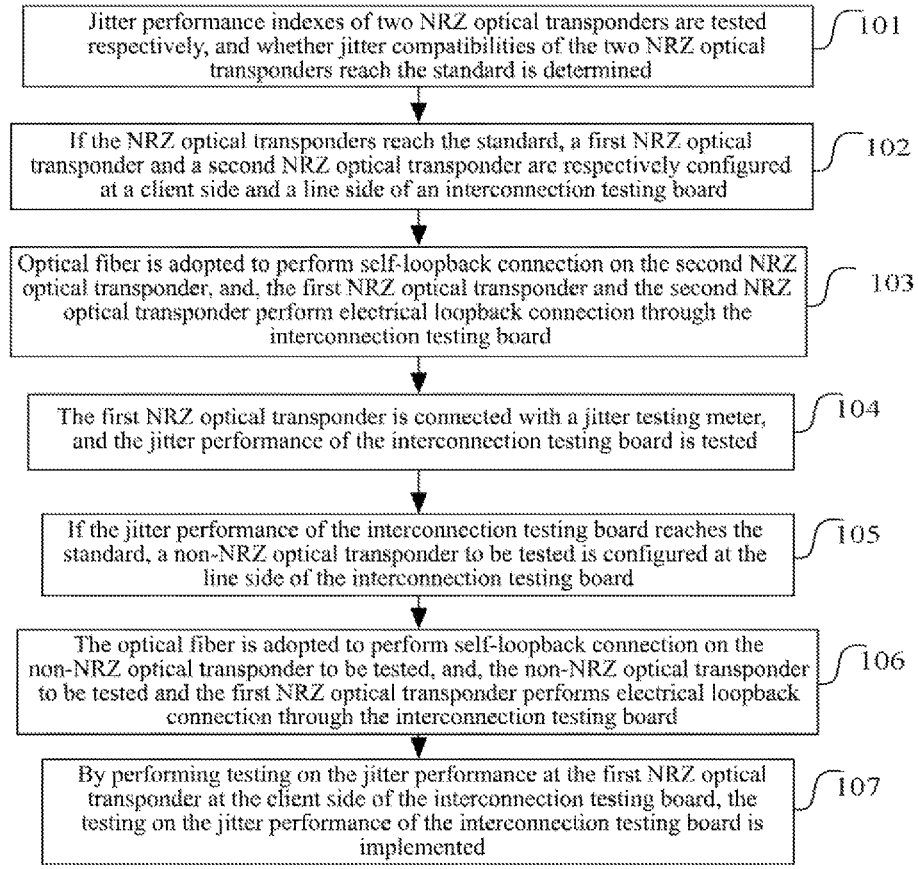
FIG. 1 is a flow diagram of the method for testing jitter compatibility according to the embodiment.

FIG. 1 illustrates the method for testing jitter compatibility according to the embodiment, which implements testing on the jitter compatibility of the non-NRZ optical transponder configured at the line side of the interconnection testing board, and the following steps are included.

Figure 2:
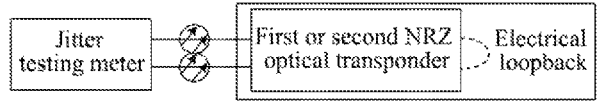
FIG. 2 is a principle block diagram of testing jitter performance of an NRZ optical transponder according to the embodiment.

In step 101, jitter performance indexes of two NRZ optical transponders are tested respectively (referring to FIG. 2), a first NRZ optical transponder and a second NRZ optical transponder are included, and whether jitter compatibilities of the two NRZ optical transponders reach the standard is determined.

With regard to the testing on the jitter performance of the NRZ optical transponders, please refer to a protocol: 40 Gb/s Optical transponder Technical Conditions.

In step 102, if the two NRZ optical transponders reach the standard, the first NRZ optical transponder is configured at a client side of the interconnection testing board, and the second NRZ optical transponder is configured at the line side of the interconnection testing board.

Figure 3:
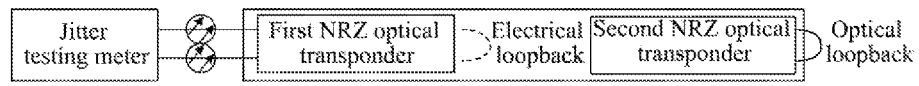
FIG. 3 is a principle block diagram of testing jitter performance of a board according to the embodiment.

In step 103, the optical fiber is adopted to perform self-loopback connection on the second NRZ optical transponder, and, the first NRZ optical transponder and the second NRZ optical transponder perform electrical loopback connection through the interconnection testing board (referring to FIG. 3).

The loopback connection means connecting an output terminal with an input terminal.

In step 104, the first NRZ optical transponder is connected with a jitter testing meter, and the jitter performance of the interconnection testing board is tested at the side of the first NRZ optical transponder, and whether the jitter performance of the interconnection testing board is qualified is judged.

With regard to the testing on the jitter performance of the interconnection testing board configured with the first NRZ optical transponder and the second NRZ optical transponder, please refer to a protocol: Method for Testing N×40 Gbit/s Wavelength Division Multiplexing (WDM) System, and the protocol is a board jitter performance specification.

In step 105, if the jitter performance of the interconnection testing board reaches the standard, the connection between the first NRZ optical transponder and the jitter testing meter is kept, and the second NRZ optical transponder is removed from the board, and a non-NRZ optical transponder to be tested is configured at the line side of the interconnection testing board.

In step 106, the optical fiber is adopted to perform self-loopback connection on the non-NRZ optical transponder to be tested, and, the non-NRZ optical transponder to be tested and the first NRZ optical transponder performs electrical loopback connection through the interconnection testing board.

A signal converter is contained in the electrical loopback connection, and the signal converter uses a framer configured on the interconnection testing board, and when the framer transmits an optical signal between the NRZ optical transponder at the client side and the non-NRZ optical transponder at the line side, it converts a format of the optical signal to a format satisfying requirements of the non-NRZ optical transponder.

In step 107, by testing the jitter performance at the first NRZ optical transponder at the client side of the interconnection testing board, it implements the testing on the jitter performance of the interconnection testing board, and judges whether the jitter performance of the interconnection testing board is qualified, so as to further judge whether the jitter performance of the non-NRZ optical transponder to be tested is qualified.

If the jitter performance of the interconnection testing board is qualified, it is believed that the jitter compatibility of the non-NRZ optical transponder to be tested is qualified; and if the jitter performance of the interconnection testing board is unqualified, it is also believed that the jitter compatibility of the non-NRZ optical transponder to be tested is unqualified.

When performing testing on the jitter performance of the interconnection testing board, the jitter testing meter sends a testing optical signal to the NRZ optical transponder, and the NRZ optical transponder performs optical-to-electrical conversion on the testing optical signal and obtains an electrical signal, and it performs format conversion on the electrical signal through the signal converter and loops back the electrical signal to the non-NRZ optical transponder to be tested; the non-NRZ optical transponder to be tested performs electrical-to-optical conversion on the electrical signal and obtains the optical signal, and it loops back the optical signal to a receiving terminal of the non-NRZ optical transponder to be tested, and then it performs optical-to-electrical conversion, obtains the electrical signal, and loops back the electrical signal to a transmitting terminal of the NRZ optical transponder; the NRZ optical transponder performs electrical-to-optical conversion on the received electrical signal and transmits the obtained optical signal to the input terminal of the jitter testing meter, thereby obtaining the jitter performance of the interconnection testing board.

Figure 4:
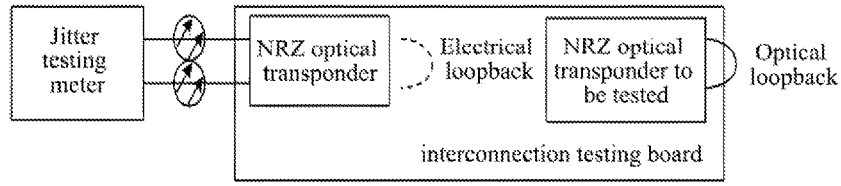
FIG. 4 is an architecture diagram of the system for testing jitter compatibility according to the embodiment.

FIG. 4 is a system for testing jitter compatibility according to the embodiment, which implements testing on the jitter compatibility of an optical transponder based on a non-NRZ modulation format, comprising:

the NRZ optical transponder, which satisfies the standards and templates for testing the jitter compatibility of the optical transponder at a client side in the existing International Telecommunication Union Telecommunication Standardization Sector (ITU-T), performs interconnection testing with a non-NRZ optical transponder to be tested, and is configured at the client side of the interconnection testing board.

The interconnection testing board contains a framer which provides the data interconnection satisfying a communication transport protocol for the NRZ optical transponder and the optical transponder in the non-NRZ format, and provides a testing platform and an interface for testing the jitter compatibility. The board is utilized to test the jitter compatibility indexes of the non-NRZ optical transponder.

The testing platform provides functions such as power supply, electrical interfaces, input/output of control signal and status signal, signal direction and signal processing and so on. The interfaces mainly refer to external interconnection interfaces of the board, input/output interfaces for optical signals and so on.

A jitter testing meter is connected with the NRZ optical transponder, and performs testing on the jitter compatibility of the NRZ optical transponder at the client side of the interconnection testing board, so as to judge whether the jitter compatibility of the interconnection testing board reaches the standard, thereby judging whether the jitter compatibility of the non-NRZ optical transponder to be tested satisfies the requirements.

The non-NRZ optical transponder to be tested is configured at a line side of the interconnection testing board, so as to perform testing on the jitter compatibility.

With regard to the specific functions of all components in the system, please refer to descriptions in the contents of the method, which will not be repeated here.

APPLICATION EXAMPLE

A Differential Quadrature Phase Shift Keying (DQPSK) optical transponder serving as a non-NRZ optical transponder is taken as an example below, and the DQPSK optical transponder is an optical transponder based on the DQPSK phase modulation technology, and a principle thereof is to bear data on a differential phase close to an optical pulse, that is, optical carrier phases of two signal pulses in front and back determines the current signal value. As long as the change of the current signal satisfies 00→01→11→10→00, and the change of phase of the optical carrier is equal to $\pi/2$ or $-\pi/2$ each time, signal transmission can be performed.

When the jitter compatibility of the DQPSK optical transponder is tested, it is required to use two NRZ optical transponders and a jitter analysis meter, and to take an OTU board as an interconnection testing board, and when the DQPSK optical transponder and the NRZ optical transponders are configured on the OTU board, one integrated system which can perform testing on the jitter compatibility of the DQPSK optical transponder is constituted.

Figure 5:
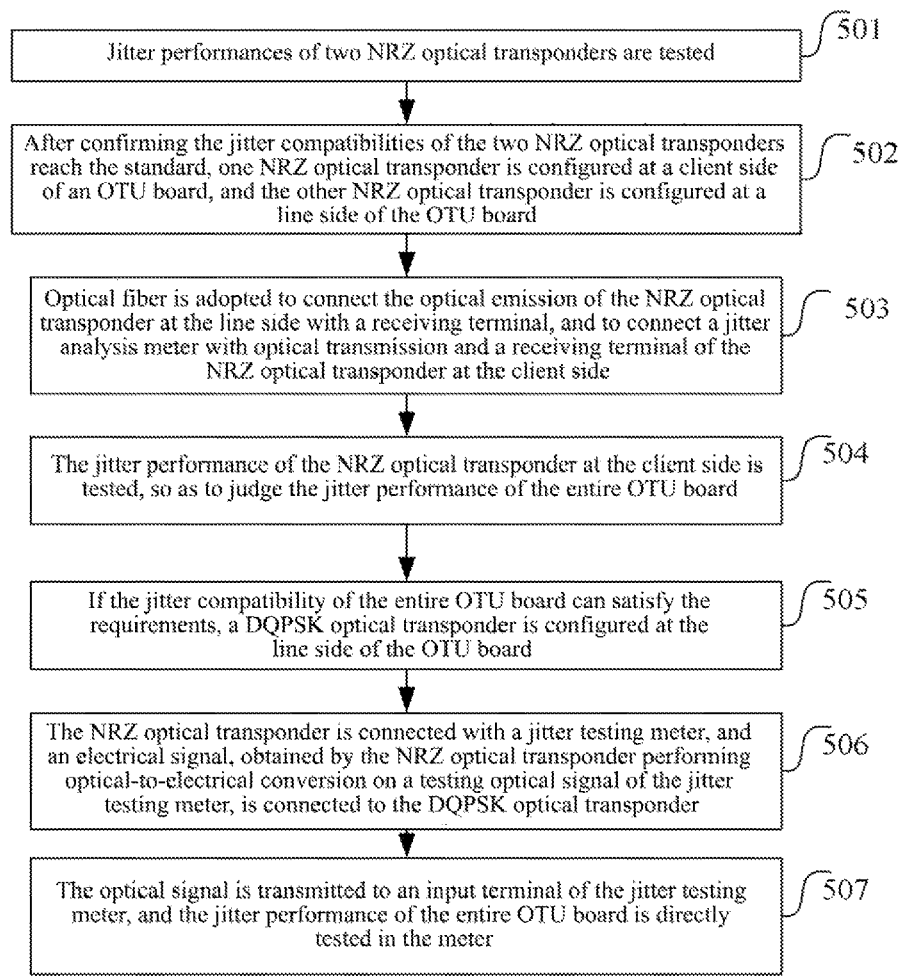
FIG. 5 is a flow diagram of the method for testing jitter compatibility of a Differential Quadrature Phase Shift Keying (DQPSK) optical transponder according to the embodiment.

As shown in FIG. 5, the method for testing the jitter compatibility of the DQPSK optical transponder includes the following steps.

In step 501, jitter performances of two NRZ optical transponders are tested.

The specific method is: taking an NRZ optical transponder as a module of a client side which is configured on the OTU board, a testing optical signal of the jitter analysis meter being input to a receiving terminal of the NRZ optical transponder through optical fiber, the NRZ optical transponder performing loopback connection on an electrical signal obtained from optical-to-electrical conversion to a transmitting terminal in the way of one electrical loopback, further performing electrical-to-optical conversion inside the module, sending an optical signal obtained from the conversion to the jitter analysis meter, and directly using the jitter analysis meter to test whether the jitter performance of the NRZ optical transponder is qualified.

In step 502, after confirming the jitter performances of the two NRZ optical transponders reach the standard, one NRZ optical transponder is taken as the module of the client side and configured on the OTU board, and the other NRZ optical transponder is configured on a line side of the OTU board.

In step 503, the optical fiber is adopted to connect optical emission of the NRZ optical transponder at the line side with the receiving terminal, and to connect the jitter analysis meter with the optical transmission and receiving terminal of the NRZ optical transponder at the client side, and electrical loopback connection is performed between the NRZ optical transponder at the line side and the NRZ optical transponder at the client side through the OTU board.

In step 504, the jitter performance of the NRZ optical transponder at the client side is tested, so as to judge the jitter performance of the entire OTU board.

In step 505, if the jitter compatibility of the entire OTU board can satisfy the requirements, the DQPSK optical transponder is configured at the line side of the OTU board.

In step 506, the client side of the OTU board is configured with the NRZ optical transponder and is connected with a jitter testing meter, and an electrical signal, obtained by the NRZ optical transponder performing optical-to-electrical conversion on a testing optical signal of the jitter testing meter, is connected to the DQPSK optical transponder through the framer of OTU board converting the electrical signal at the client side into a electrical signal in the frame format which is required at the line side.

In step 507, after performing electrical-to-optical conversion on the electrical signal, the DQPSK optical transponder loops back the obtained optical signal to the receiving terminal of the DQPSK optical transponder, performs optical-to-electrical conversion, and transmits the obtained electrical signal to the transmitting terminal of the NRZ optical transponder through the electrical loopback connection, and the NRZ optical transponder performs electrical-to-optical conversion and transmits the obtained optical signal to an input terminal of the jitter testing meter, and the jitter performance of the entire OTU board is directly tested in the meter.

If the jitter compatibility of the OTU board is qualified, it is proved that the jitter compatibility of the DQPSK optical transponder is qualified; and if the jitter compatibility of the OTU board is unqualified, it is proved that the jitter compatibility of the DQPSK optical transponder is also unqualified, and system requirements can not be satisfied.

Though the preferred examples of the present invention have been disclosed for the purpose of giving a demonstration, the skilled person in the art will realize that various improvements, increments and substitutions are also conceivable. Therefore, the scope of the present invention should not be limited to the above examples.

The ordinary person skilled in the art can understand that all or part of the steps in the above method can be completed by a program instructing related hardware, and the program can be stored in a computer readable memory medium, such as a read-only memory, disk or optical disk and so on. Alternatively, all or part of the steps of the above examples also can be implemented by using one or multiple integrated circuits. Correspondingly, each module/unit in the above examples can be implemented in a form of hardware, and also can be implemented in a form of software function module. The present invention is not limited to any combination of hardware and software in a specific form.

INDUSTRIAL APPLICABILITY

The present invention introduces a method for indirectly testing jitter compatibility of an optical transponder in a non-NRZ modulation format, and uses the existing devices and testing means to implement judgments on the jitter compatibility of the optical transponder in the non-NRZ modulation format, which can reflect the jitter performance of the optical transponder in the non-NRZ modulation format more truly, and provide a basis for inspecting jitter compatibility indexes of such kind of modules. With the present, in the condition that no existing testing meter and standard specification directly support the jitter compatibility testing of the optical transponder in the non-NRZ modulation format, the testing on the jitter compatibility is implemented, which truly reflects whether the jitter performance of the optical transponder in the non-NRZ modulation format can satisfy system requirements.

What is claimed is:

1. A method for testing jitter performance of a non-No Return Zero (NRZ) optical transponder, comprising:
   configuring an interconnection testing board by placing the non-NRZ optical transponder to be tested at a line side of the interconnection testing board and placing a NRZ optical transponder at a client side of the interconnection testing board, wherein the jitter performance of said NRZ optical transponder satisfies a pre-defined standard, and it has been tested that the jitter performance of said interconnection testing board, with two NRZ optical transponders whose jitter performances satisfy the standard being respectively configured at the line side and the client side of the interconnection testing board, satisfies a pre-defined board jitter performance specification;
   performing testing on the jitter performance of said interconnection testing board configured with said non-NRZ optical transponder and said NRZ optical transponder;
   when it is tested that the jitter performance of said interconnection testing board configured with said non-NRZ optical transponder and said NRZ optical transponder still satisfies the board jitter performance specification, determining that the jitter performance of said non-NRZ optical transponder satisfies a requirement of jitter performance; when it is tested that the jitter performance of said interconnection testing board configured with said non-NRZ optical transponder and said NRZ optical transponder no longer satisfies the board jitter performance specification, determining that the jitter performance of said non-NRZ optical transponder does not satisfy the requirement of jitter performance.

2. The method according to claim 1, wherein, performing testing on the jitter performance of the interconnection testing board configured with said non-NRZ optical transponder and said NRZ optical transponder comprises:
   performing self-loopback connection on the non-NRZ optical transponder to be tested, and, the non-NRZ optical transponder to be tested and the NRZ optical transponder performing electrical loopback connection through the interconnection testing board;
   connecting a jitter testing meter to the NRZ optical transponder, so as to perform testing on the jitter performance of the interconnection testing board at the side of the NRZ optical transponder, thereby judging whether the jitter performance of the interconnection testing board satisfies the board jitter performance specification.

3. The method according to claim 2, wherein, a signal converter is configured in the electrical loopback connection, and the method further comprises:
   when the NRZ optical transponder sends an electrical signal to the non-NRZ optical transponder to be tested through the electrical loopback connection, the signal converter converting a format of the sent electrical signal to a format satisfying requirements of the non-NRZ optical transponder to be tested.

4. The method according to claim 1, wherein, before the step of performing testing on the jitter performance of said interconnection testing board configured with said non-NRZ optical transponder and said NRZ optical transponder, the method comprises:
   performing testing and obtaining two NRZ optical transponders whose jitter performance satisfy the standard, and configuring the two NRZ optical transponders at the line side and the client side of the interconnection testing board respectively;
   after completing the configuration of the two NRZ optical transponders on the interconnection testing board, performing testing on the jitter performance of the interconnection testing board, when the jitter performance satisfies the board jitter performance specification, removing the NRZ optical transponder at the line side of the interconnection testing board, and configuring the non-NRZ optical transponder to be tested at the line side of the interconnection testing board.

5. The method according to claim 3, wherein, the step of performing testing on the jitter performance of the interconnection testing board configured with said non-NRZ optical transponder and said NRZ optical transponder comprises:
   the jitter testing meter sending a testing optical signal to the NRZ optical transponder;
   the NRZ optical transponder performing optical-to-electrical conversion on the testing optical signal, performing format conversion on the obtained electrical signal through the signal converter, and performing electrical loopback connection on the electrical signal to the non-NRZ optical transponder to be tested;
   the non-NRZ optical transponder to be tested performing electrical-to-optical conversion on the electrical signal, looping back the obtained optical signal to a receiving terminal of the non-NRZ optical transponder to be tested, further performing optical-to-electrical conversion, and performing electrical loopback connection on the obtained electrical signal to a transmitting terminal of the NRZ optical transponder; and
   the NRZ optical transponder performing electrical-to-optical conversion on the received electrical signal, and transmitting the obtained optical signal to an input terminal of the jitter testing meter, thereby obtaining the jitter performance of the interconnection testing board.

6. A system for testing jitter performance of a non-No Return Zero (NRZ) optical transponder, comprising: a NRZ optical transponder, an interconnection testing board and a jitter testing meter, wherein:
   the NRZ optical transponder is configured at a client side of the interconnection testing board, and the jitter performance of the NRZ optical transponder satisfies a pre-defined standard;
   the interconnection testing board is configured to provide a testing platform and an interface, wherein the non-NRZ optical transponder to be tested is configured at a line side of the interconnection testing board, and it has been tested that the jitter performance of said interconnection testing board, with two NRZ optical transponders whose jitter performances satisfy the standard being respectively configured at the line side and the client side of the interconnection testing board, satisfies a pre-defined board jitter performance specification; and
   the jitter testing meter, connected with the NRZ optical transponder, is configured to: performing testing on the jitter performance of the interconnection testing board configured with said non-NRZ optical transponder and said NRZ optical transponder; wherein when it is tested that the jitter performance of said interconnection testing board configured with said non-NRZ optical transponder and said NRZ optical transponder still satisfies the board jitter performance specification, the jitter performance of said non-NRZ optical transponder is determined as satisfying a requirement of jitter performance; when it is tested that the jitter performance of said interconnection testing board configured with said non-NRZ optical transponder and said NRZ optical transponder no longer satisfies the board jitter performance specification, the jitter performance of said non-NRZ optical transponder is determined as not satisfying the requirement of jitter performance.

7. The system according to claim 6, wherein, the non-NRZ optical transponder to be tested performs a self-loopback connection, and the non-NRZ optical transponder to be tested and the NRZ optical transponder performs electrical loopback connection through the interconnection testing board.

8. The system according to claim 7, wherein, a signal converter is configured in the electrical loopback connection; the signal converter is configured to: when the NRZ optical transponder sends an electrical signal to the non-NRZ optical transponder to be tested through the electrical loopback connection, convert a format of the sent electrical signal to a format satisfying requirements of the non-NRZ optical transponder to be tested.

9. The system according to claim 8, wherein, when performing testing on the jitter performance of the interconnection testing board configured with said non-NRZ optical transponder and said NRZ optical transponder, the jitter testing meter sends a testing optical signal to the NRZ optical transponder;

the NRZ optical transponder performs optical-to-electrical conversion on the testing optical signal, performs format conversion on the obtained electrical signal through the signal converter, and performs the electrical loopback connection on the electrical signal to the non-NRZ optical transponder to be tested;

the non-NRZ optical transponder to be tested performs electrical-to-optical conversion on the electrical signal, loops back the obtained optical signal to a receiving terminal of the non-NRZ optical transponder to be tested, further performs optical-to-electrical conversion, and performs the electrical loopback connection on the obtained electrical signal to a transmitting terminal of the NRZ optical transponder; and the NRZ optical transponder performs electrical-to-optical conversion on the received electrical signal, and transmits the obtained optical signal to an input terminal of the jitter testing meter, thereby the jitter testing meter obtains the jitter performance of the interconnection testing board.

* * * * *